US008728705B2

(12) United States Patent  
Hirashima et al.

(10) Patent No.: US 8,728,705 B2  
(45) Date of Patent: May 20, 2014

(54) NEGATIVE PHOTOSENSITIVE MATERIAL, PHOTOSENSITIVE BOARD EMPLOYING THE NEGATIVE PHOTOSENSITIVE MATERIAL, AND NEGATIVE PATTERN FORMING METHOD

(75) Inventors: Katsutoshi Hirashima, Ibaraki (JP); Hirofumi Fujii, Ibaraki (JP); Yasushi Tamura, Ibaraki (JP); Ryouji Suezaki, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 99 days.

(21) Appl. No.: 12/788,837

(22) Filed: May 27, 2010

(65) Prior Publication Data

US 2010/0304298 A1 Dec. 2, 2010

(30) Foreign Application Priority Data

May 27, 2009 (JP) ................................ 2009-127715

(51) Int. Cl.  
*G03F 7/038* (2006.01)  
*G03F 7/38* (2006.01)

(52) U.S. Cl.  
CPC ................ *G03F 7/0387* (2013.01); *G03F 7/38* (2013.01); *Y10S 430/107* (2013.01)  
USPC ......... 430/270.1; 430/325; 430/330; 430/906

(58) Field of Classification Search  
CPC .................................. G06F 7/0387; G06F 7/38  
USPC ................ 430/270.1, 906, 325, 330  
See application file for complete search history.

(56) References Cited

U.S. PATENT DOCUMENTS

| | | | | |
|---|---|---|---|---|
| 5,858,518 A | * | 1/1999 | Omote et al. | ................ 428/209 |
| 6,048,663 A | * | 4/2000 | Fujii et al. | ................ 430/270.1 |
| 6,096,482 A | * | 8/2000 | Omote et al. | ................ 430/311 |
| 6,100,582 A | * | 8/2000 | Omote et al. | ................ 257/699 |

(Continued)

FOREIGN PATENT DOCUMENTS

| | | |
|---|---|---|
| JP | 7-179604 A | 7/1995 |
| JP | 2000-112126 A | 4/2000 |

(Continued)

OTHER PUBLICATIONS

Chinese Office Action dated May 31, 2012, issued in corresponding Chinese Patent Application No. 201010185976.2, w/ English translation.

(Continued)

*Primary Examiner* — John Chu  
(74) *Attorney, Agent, or Firm* — Westerman, Hattori, Daniels & Adrian, LLP

(57) ABSTRACT

A negative photosensitive material is provided which has a lower linear expansion coefficient and a lower hygroscopic expansion coefficient and is excellent in gradational patternability and PI etchability in patterning. The negative photosensitive material comprises:

(A) a polyimide precursor having a structural unit represented by the following general formula (1) and a structural unit represented by the following general formula (2), the structural unit represented by the general formula (2) being present in the polyimide precursor in a proportion of less than 30 mol % based on the overall amount of the polyimide precursor; and

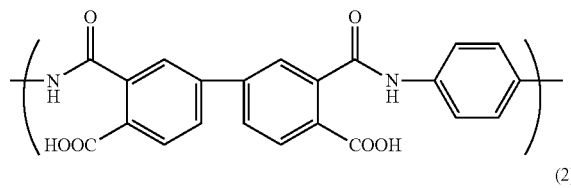

(B) at least one of a pyridine derivative represented by the following general formula (3) and a pyridine derivative represented by the following general formula (4):

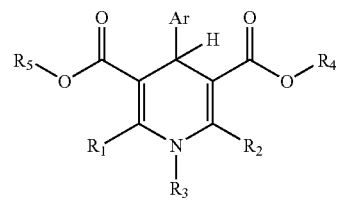

wherein $R_1$, $R_2$, $R_3$, $R_4$ and $R_5$, which may be the same or different, are each a $C_1$ to $C_4$ alkyl group, and Ar is an aryl group having a nitro group at its ortho position,

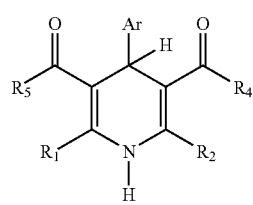

wherein $R_1$, $R_2$, $R_4$ and $R_5$, which may be the same or different, are each a $C_1$ to $C_4$ alkyl group, and Ar is an aryl group having a nitro group at its ortho position.

12 Claims, 4 Drawing Sheets

(56) References Cited

U.S. PATENT DOCUMENTS

| | | | |
|---|---|---|---|
| 6,132,930 A | 10/2000 | Hayashi et al. | |
| 7,336,446 B2 | 2/2008 | Kanagawa et al. | |
| 7,371,506 B2 * | 5/2008 | Fujii et al. | 430/270.1 |
| 2010/0047626 A1 | 2/2010 | Hitomi et al. | |

FOREIGN PATENT DOCUMENTS

| | | |
|---|---|---|
| JP | 2002-124743 A | 4/2002 |
| JP | 3332278 B2 | 10/2002 |
| JP | 2005-167066 A | 6/2005 |
| JP | 2008-310946 A | 12/2008 |
| WO | 2008/133072 A1 | 11/2008 |

OTHER PUBLICATIONS

Chinese Office Action dated Jul. 4, 2013, issued in corresponding Chinese Patent Application No. 201010185976.2, w/ English translation.

Chinese Office Action dated Dec. 18, 2012, issued in corresponding Chinese patent application No. 201010185976.2, w/ English translation.

Japanese Notice of Allowance dated Feb. 5, 2013, issued in corresponding Japanese patent application No. 2009-127715, w/ English translation.

* cited by examiner

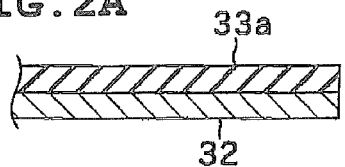
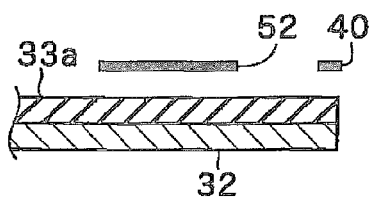
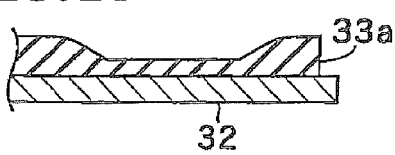
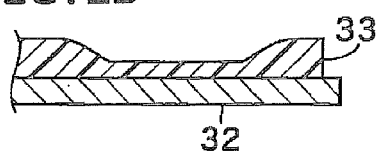
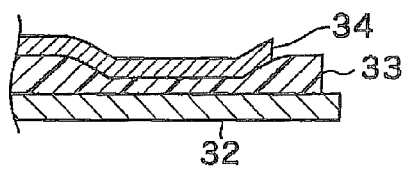
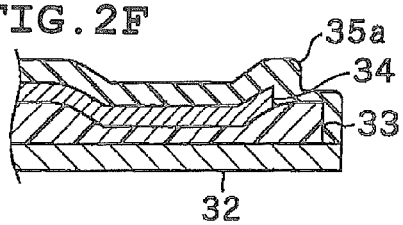
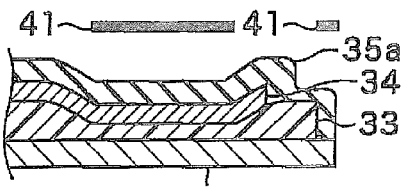
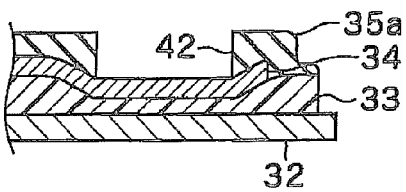
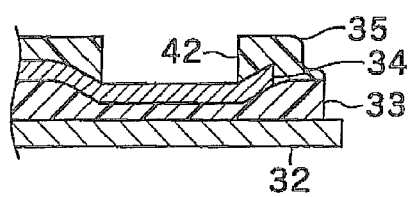
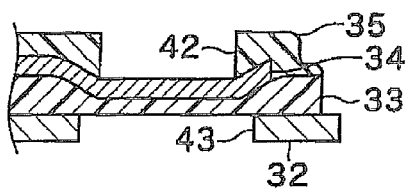
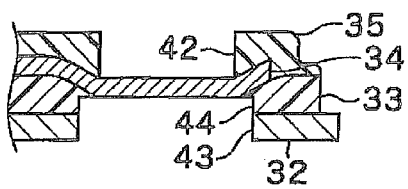

NEGATIVE PHOTOSENSITIVE MATERIAL, PHOTOSENSITIVE BOARD EMPLOYING THE NEGATIVE PHOTOSENSITIVE MATERIAL, AND NEGATIVE PATTERN FORMING METHOD

BACKGROUND OF THE INVENTION

1. Field of the Invention

The present invention relates to a negative photosensitive material containing a photosensitive polyimide precursor (polyamic acid) for formation of a negative pattern, and a photosensitive board employing the negative photosensitive material. The present invention further relates to a negative pattern forming method to be used for producing a hard disk drive suspension board and other circuit-containing suspension board. With a low linear expansion coefficient and a low hygroscopic expansion coefficient, the board produced by this method is substantially free from warpage due to hygroscopic influence. Further, the board can be subjected to polyimide etching (PI etching).

2. Description of the Related Art

In recent years, hard disk drives (hereinafter sometimes referred to as "HDD") to be incorporated in personal computers are required to have a higher capacity and a higher information transmission speed. Such an HDD includes a so-called magnetic head, and a so-called magnetic head suspension which supports the magnetic head.

With a recent rapidly increasing demand for the higher capacity, the HDD is required to access a minute region for reading and writing, so that a distance between the magnetic head and a disk tends to be reduced. For precise control of the distance between the magnetic head and the disk, a polyimide photosensitive material having a low linear expansion coefficient and a low hygroscopic expansion coefficient is used instead of a conventional epoxy resin photosensitive material as an insulative resin for preparation of a base on which wirings are formed. On the other hand, HDDs to be mounted in smaller-size devices such as portable devices are also increasingly required to meet various demands. A disk of such an HDD for recording information has a smaller diameter and a correspondingly higher recording density. In order to access a track of the smaller-diameter disk for the data reading and the data writing, the HDD is required to slowly rotate the disk. Therefore, the relative speed (circumferential speed) of the disk with respect to a magnetic head is low, so that a suspension board should be moved toward the disk with a smaller force. Hence, the suspension board is required to have a lower rigidity.

The suspension board of the HDD typically includes a metal substrate, an insulative layer, an interconnection layer and a cover layer, which are patterned and stacked in this order. A conceivable method for imparting the suspension board with a lower rigidity is to reduce the residual proportion of the metal substrate which has a relatively high rigidity. With the reduction of the residual proportion of the highly rigid metal substrate, however, the suspension board is liable to warp. To cope with this problem, JP-A-2008-310946 proposes that a polyimide precursor having a lower hygroscopic expansion coefficient is used as a material for the insulative layer and the cover layer to suppress the warpage of the suspension board. Further, Japanese Patent No. 3332278 proposes that a wiring circuit board of a multilayer structure including a plurality of thin films and having a lower linear expansion coefficient is produced by using a polyimide precursor that is unlikely to suffer from accumulation of interlayer residual stress.

However, a material containing the polyimide precursor is inferior in gradational patternability and PI etchability (i.e., it is difficult to properly pattern the material through a gradational exposure and development process and a PI etching process) and, therefore, unsatisfactory in this regard.

In view of the foregoing, it is an object of the present invention to provide a negative photosensitive material having a low linear expansion coefficient and a low hygroscopic expansion coefficient, a photosensitive board employing the negative photosensitive material, and a negative pattern forming method which ensures excellent gradational patternability and excellent PI etchability in patterning the negative photosensitive material.

SUMMARY OF THE INVENTION

According to a first aspect of the present invention to achieve the aforementioned object, there is provided a negative photosensitive material comprising:

(A) a polyimide precursor having a structural unit represented by the following general formula (1) and a structural unit represented by the following general formula (2), the structural unit (2) being present in the polyimide precursor in a proportion of less than 30 mol % based on the overall amount of the polyimide precursor; and

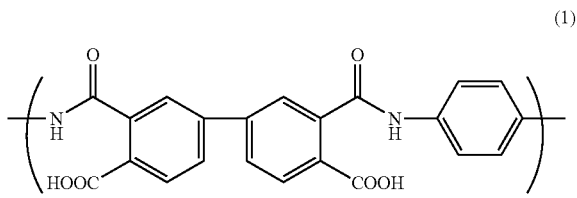

(1)

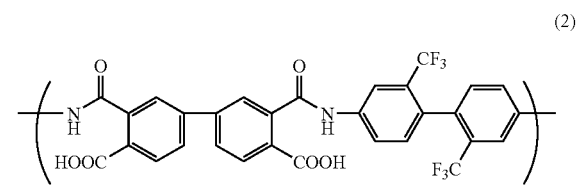

(2)

(B) at least one of a pyridine derivative represented by the following general formula (3) and a pyridine derivative represented by the following general formula (4):

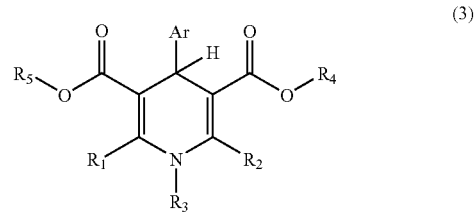

(3)

wherein $R_1$, $R_2$, $R_3$, $R_4$ and $R_5$, which may be the same or different, are each a $C_1$ to $C_4$ alkyl group, and Ar is an aryl group having a nitro group at its ortho position,

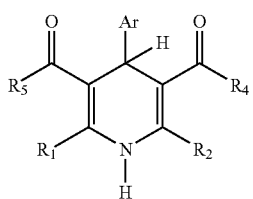

(4)

wherein $R_1$, $R_2$, $R_4$ and $R_5$, which may be the same or different, are each a $C_1$ to $C_4$ alkyl group, and Ar is an aryl group having a nitro group at its ortho position.

According to a second aspect of the present invention, there is provided a photosensitive board comprising a substrate, and a coating film of the negative photosensitive material provided on a surface of the substrate.

According to a third aspect of the present invention, there is provided a negative pattern forming method comprising the steps: irradiating a surface of a film of the negative photosensitive material or a surface of the coating film of the photosensitive board with activation radiation via a photomask having a predetermined pattern; heat-treating the film at a temperature not lower than 170° C.; and removing an unexposed portion of the film by using a basic developing liquid to form a negative pattern.

According to a fourth aspect of the present invention, there is provided a negative pattern forming method comprising the steps of: gradationally exposing a surface of a film of the negative photosensitive material or a surface of the coating film of the photosensitive board by irradiation with activation radiation via a photomask having a predetermined pattern; heat-treating the film at a temperature not lower than 170° C.; and gradationally developing the film by using a basic developing liquid to form a negative pattern.

The inventors of the present invention conducted a series of studies to provide a negative photosensitive material having a low linear expansion coefficient and a low hygroscopic expansion coefficient. As a result, the inventors found that a negative photosensitive material prepared by using the polyimide precursor (A) having the structural unit represented by the above general formula (1) and less than 30 mol % of the structural unit represented by the above general formula (2) based on the overall amount of the polyimide precursor, and at least one of the pyridine derivative represented by the above general formula (3) and the pyridine derivative represented by the above general formula (4) is excellent in PI etchability and gradational patternability, because it permits formation of a smooth gradational pattern without in-plane variations and PI etching without residue. Thus, the inventors attain the present invention.

As described above, the inventive negative photosensitive material comprises: (A) the polyimide precursor having the structural unit represented by the above general formula (1) and the structural unit represented by the above general formula (2), the structural unit (2) being present in the polyimide precursor in a proportion of less than 30 mol % based on the overall amount of the polyimide precursor; and (B) at least one of the pyridine derivative represented by the above general formula (3) and the pyridine derivative represented by the above general formula (4). The inventive photosensitive board comprises the substrate, and the coating film of the negative photosensitive material provided on the surface of the substrate. The negative photosensitive material and the photosensitive board are excellent in gradational patternability and PI etchability. Therefore, when a flying lead is formed by the negative pattern forming method employing the negative photosensitive material or the photosensitive board, it is possible to provide a flat terminal, which can be more reliably connected to an external board.

In the negative pattern forming method employing the negative photosensitive material or the photosensitive board, the negative pattern is formed by gradationally exposing the surface of the film of the negative photosensitive material or the surface of the coating film of the photosensitive board by irradiation with the activation radiation via the photomask having the predetermined pattern, heat-treating the film at a temperature not lower than 170° C., and gradationally developing the film by using the basic developing liquid. With the excellent gradational patternability and the excellent PI etchability, as described above, it is possible to provide a flat terminal when a flying lead is formed by the gradational exposure and the gradational development.

BRIEF DESCRIPTION OF THE DRAWINGS

FIGS. 2A to 2K are process diagrams showing a process for producing the circuit-containing suspension board, particularly, FIG. 2A showing the step of forming a first coating film of a photosensitive polyamic acid composition on a substrate, FIG. 2B showing the step of exposing the first coating film via a photomask, FIG. 2C showing the step of developing the first coating film into a predetermined pattern, FIG. 2D showing the step of curing the patterned first coating film to form a base layer, FIG. 2E showing the step of forming an electrically conductive pattern on the base layer, FIG. 2F showing the step of forming a second coating film of the photosensitive polyamic acid composition over the electrically conductive pattern, FIG. 2G showing the step of exposing the second coating film via a photomask, FIG. 2H showing the step of developing the second coating film into a predetermined pattern, FIG. 2I showing the step of curing the patterned second coating film to form a cover layer, FIG. 2J showing the step of forming an opening in a portion of the substrate to be formed with an external connection terminal, FIG. 2K showing the step of forming an opening in a portion of the base layer to be formed with the external connection terminal.

DETAILED DESCRIPTION OF THE PRESENT INVENTION

Figure 1:
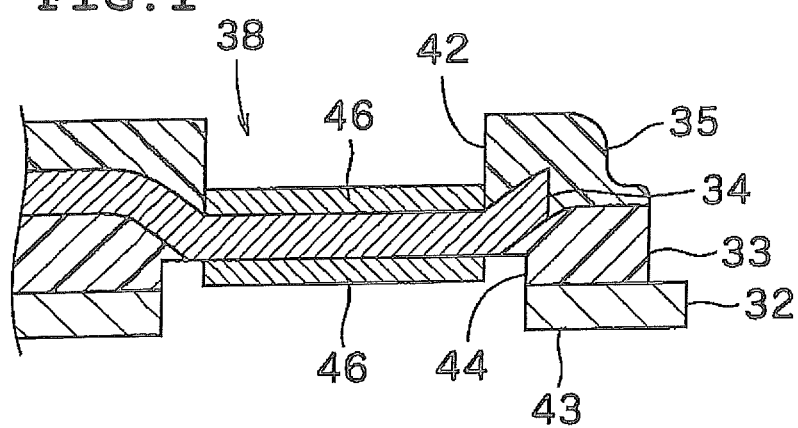
FIG. 1 is a sectional view of a major portion of a circuit-containing suspension board according to one embodiment of the present invention.

Embodiments of the present invention will hereinafter be described.

A negative photosensitive material according to the present invention is a photosensitive polyamic acid composition prepared by using a polyimide precursor (A) and a pyridine derivative (B), and used for forming a so-called negative pattern which is defined by an exposed portion remaining after an exposure and development process.

The polyimide precursor (A) is a polyamic acid having a structural unit represented by the following general formula (1) and a structural unit represented by the following general formula (2).

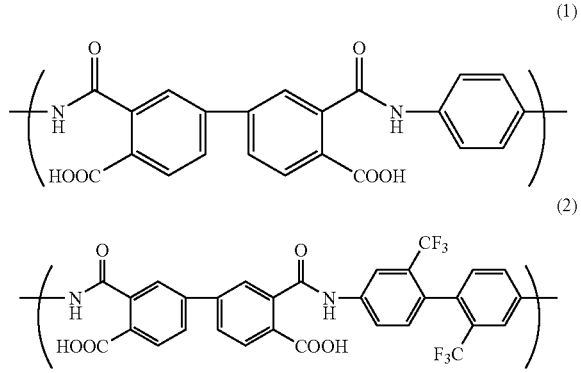

In the present invention, the polyimide precursor having the structural units represented by the above general formulae (1) and (2) are subjected to an ordinary imidization process, for example, a thermal ring closing process or a chemical ring closing process with the use of pyridine anhydride, to be imidized into a polyimide through cycloimidization. The resulting polyimide has a low linear expansion coefficient and a low elastic modulus, and is excellent in adhesion to other polyimide.

The polyimide precursor having the structural units represented by the general formulae (1) and (2) is prepared, for example, by causing a tetracarboxylic acid component and a diamine component to react with each other in an organic solvent.

Examples of the tetracarboxylic acid component include 3,3',4,4'-biphenyltetracarboxylic acid derivatives such as 3,3',4,4'-biphenyltetracarboxylic dianhydride, 3,3',4,4'-biphenyltetracarboxylic halides and 3,3',4,4'-biphenyltetracarboxylates, which may be used either alone or in combination.

The diamine component is prepared by using at least two types of diamines. Examples of one of the two types of diamines include aromatic diamines having aromatic rings such as benzene, biphenyl, triphenyl, terphenyl, toluene, xylene and tolidine, and an example is p-phenylenediamine. Examples of the other type of diamine include fluorinated and methylated benzidines, and an example is 2,2'-bis(trifluoromethyl)-4,4'-diaminobiphenyl. The ratio between the former type and the latter type of diamines is generally such that the latter type of diamine is typically present in a molar ratio of less than 30%. Preferably, the molar ratio between the former type and the latter type of diamines is 75:25 to 95:5. If the ratio of the latter type of diamine is too high, the resulting photosensitive material has an excessively low PI etching rate, and fails to exhibit sharp contrast between a gradation region and a non-gradation region. In the present invention, the polyimide precursor (A) having the aforementioned structural units may be prepared by using other type of tetracarboxylic acid component and other type of diamine component, as long as the linear expansion coefficient and the elastic modulus are not adversely affected.

Examples of the organic solvent include N-methyl-2-pyrrolidone, dimethylacetamide, dimethyl sulfoxide, dimethylformamide and hexamethylphosphoric amide, which may be used either alone or in combination.

In the present invention, the structural unit represented by the general formula (2) should be present in the polyimide precursor (A) in a proportion of less than 30 mol %, preferably not less than 5 mol % and less than 30 mol %, particularly preferably 10 to 25 mol %, based on the overall amount of the polyimide precursor. If the proportion of the structural unit represented by the general formula (2) in the precursor is too high, the resulting photosensitive material is poorer in gradational patternability and PI etchability.

The pyridine derivative (B) is at least one of a compound represented by the following general formula (3) and a compound represented by the following general formula (4), which each have a molecular structure to be transformed to a pyridine skeleton to serve as a base when being irradiated with activation radiation such as ultraviolet radiation. Then, the resulting compound is heat-treated and further caused to chemically react alone or with the polyimide precursor (A), thereby having reduced alkali solubility. Thus, there is a significant difference in solubility between the exposed portion and an unexposed portion to provide an advantageous negative pattern.

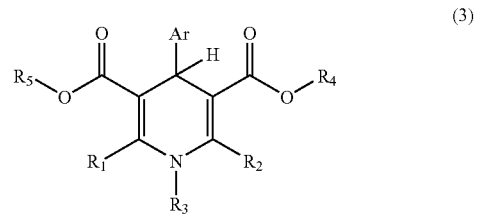

wherein $R_1$, $R_2$, $R_3$, $R_4$ and $R_5$, which may be the same or different, are each a $C_1$ to $C_4$ alkyl group, and Ar is an aryl group having a nitro group at its ortho position.

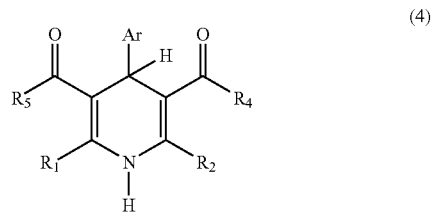

wherein $R_1$, $R_2$, $R_4$ and $R_5$, which may be the same or different, are each a $C_1$ to $C_4$ alkyl group, and Ar is an aryl group having a nitro group at its ortho position.

In the general formula (3), $R_1$, $R_2$, $R_3$, $R_4$ and $R_5$, which may be the same or different, are each a $C_1$ to $C_4$ alkyl group. Examples of the alkyl group include a methyl group, an ethyl group and a n-propyl group. Ar is an aryl group having a nitro group at its ortho position. An example of the aryl group is a 2-nitrophenyl group. A particularly preferred combination of the groups is such that $R_1$, $R_2$, $R_4$ and $R_5$ are each a methyl group, $R_3$ is a n-propyl group, and Ar is a 2-nitrophenyl group.

In the general formula (4), $R_1$, $R_2$, $R_4$ and $R_5$, which may be the same or different, are each a $C_1$ to $C_4$ alkyl group. Examples of the alkyl group include a methyl group, an ethyl group and a n-propyl group. Ar is an aryl group having a nitro group at its ortho position. An example of the aryl group is a 2-nitrophenyl group. A particularly preferred combination of the groups is such that $R_1$, $R_2$, $R_4$ and $R_5$ are each a methyl group, and Ar is a 2-nitrophenyl group.

Examples of the compound represented by the formula (4) as the pyridine derivative (B) include 2,6-dimethyl-3,5-diacetyl-4-(2'-nitrophenyl)-1,4-dihydropyridine, 2,6-diethyl-3,5-diacetyl-4-(2'-nitrophenyl)-1,4-dihydropyridine and 2,6-dipropyl-3,5-diacetyl-4-(2'-nitrophenyl)-1,4-dihydropyridine.

The pyridine derivative represented by the above general formula (3) is prepared, for example, in the following manner. The preparation of the pyridine derivative (B) represented by the above general formula (3) is achieved, for example, by causing a substituted benzaldehyde and an alkyl propiolate (alkyl propargylate) which are used in a molar ratio of 1:2 and a corresponding primary amine to react with each other in glacial acetic acid with refluxing (see Khim. Geterotsikl. Soed., pp. 1067-1071, 1982), or by introducing an ester group into a corresponding 1,4-dihydropyridine derivative such as 4-o-nitrophenyl-3,5-dimethoxycarbonyl-1,4-dihydropyridine through N-alkylation and selective hydrolysis of the ester group.

The pyridine derivative (B) represented by the above general formula (4) is prepared, for example, by causing a substituted benzaldehyde, acetylacetone and ammonia to react in a molar ratio of 1:2:1 in methanol, or through an ordinary synthesis method for a 1,4-dihydropyridine derivative (see, for example, J. Chem. Soc., 1931, 1835-1841). Alternatively, methods disclosed in West Germany Unexamined Patent Publication Nos. 2003148 and 2005116 may be employed.

The proportion of the pyridine derivative (B) including at least one of the pyridine derivative represented by the above general formula (3) and the pyridine derivative represented by the above general formula (4) is preferably 5 to 70 parts by weight (hereinafter referred to simply as "parts"), particularly preferably 15 to 55 parts, based on 100 parts of the polyimide precursor (A). If the proportion of the pyridine derivative (B) is too low, an exposed portion of the resulting photosensitive material will be more soluble, thereby reducing the solubility contrast between the exposed portion and the unexposed portion of the photosensitive material. On the other hand, if the proportion of the pyridine derivative (B) is too high, the resulting photosensitive material is liable to suffer from solid deposition when being stored in a solution form, i.e., liable to have poorer solution storage stability. After a film formed from the photosensitive material is patterned and subjected to a heat treatment, the film tends to have a significantly reduced film thickness and a lower mechanical strength.

The inventive negative photosensitive material may contain a sensitizer, as required, in addition to the polyimide precursor (A) and the pyridine derivative (B). The inventive negative photosensitive material may further contain a dissolution accelerator which increases a dissolution rate at which the unexposed portion is dissolved away with the use of the developing liquid. The dissolution accelerator is inactive with respect to the activation radiation. The dissolution accelerator is advantageous in practice, because it improves the developing speed when being contained in the photosensitive material.

Examples of the dissolution accelerator include 2,6-dimethyl-3,5-dicyano-4-methyl-1,4-dihydropyridine and 2,6-dimethyl-3,5-dicyano-1,4-dihydropyridine. In the inventive negative photosensitive material, the dissolution accelerator is preferably present in a proportion of 5 to 50 parts, particularly preferably 5 to 15 parts, based on 100 parts of the polyimide precursor (A).

The inventive negative photosensitive material is prepared, for example, by synthesizing the polyimide precursor (A), and then blending and mixing the polyimide precursor (A) with the pyridine derivative (B) and, optionally, with other ingredients (the sensitizer, the dissolution accelerator and the like).

The inventive negative photosensitive material thus prepared preferably has a hygroscopic expansion coefficient of 0 to 20 ppm/% RH, more preferably 0 to 10 ppm/% RH, and a linear expansion coefficient of 0 to 20 ppm/° C., more preferably 0 to 10 ppm/° C. If the linear expansion coefficient and the hygroscopic expansion coefficient fall outside the aforementioned ranges, there are significant differences in linear expansion coefficient and hygroscopic expansion coefficient between the negative photosensitive material and a metal material. Therefore, a board including a layer of the negative photosensitive material will suffer from warpage due to an interlayer stress.

The linear expansion coefficient is measured, for example, in the following manner. A film is formed from the negative photosensitive material, and a test sample having a width of 5 mm and a length of 25 mm is cut out of the film. With the use of a thermomechanical analyzer (THERMO PLUS TMA8310 available from Rigaku Corporation), the linear expansion coefficient of the test sample is measured. More specifically, linear thermal expansion coefficients of the test sample having a measurement length of 20 mm are measured in a temperature range of 50° C. to 200° C. with a tensile load of 50 mN while the temperature is increased at a rate of 5° C./min, and an average of the linear thermal expansion coefficients is determined as a thermal expansion coefficient (CTE).

The hygroscopic expansion coefficient is measured, for example, in the following manner. A film is formed from the negative photosensitive material, and a test sample having a width of 5 mm and a length of 25 mm is cut out of the film. With the use of a humidity-variable mechanical analyzer (THERMO PLUS TMA8310+HUM1 available from Rigaku Corporation), the hygroscopic expansion coefficient of the test sample is measured. At a constant temperature of 30° C., the test sample is stably maintained at a humidity of 3% RH for 30 minutes to 2 hours, and then the humidity of a measurement area of the test sample is changed to 20% RH and maintained for 30 minutes to 2 hours for stabilization of the test sample. Thereafter, the humidity of the measurement area is changed to 40% RH, 60% RH and 80% RH. After the test sample is stabilized at the respective humidities, the lengths of the test sample are measured with a tensile load of 50 mN, and plotted for the respective humidities. Then, the inclination of the resulting plot line is determined as the hygroscopic expansion coefficient.

Next, an exemplary method for producing a photosensitive board and forming a negative pattern by employing the inventive negative photosensitive material will hereinafter be described.

A photosensitive liquid is prepared by dissolving the polyimide precursor (A), the pyridine derivative (B) and, optionally, the sensitizer, the dissolution accelerator and the like in the organic solvent as described above. At this time, the organic solvent is preferably used, for example, in a proportion of about 200 to about 10000 parts based on a total of 100 parts of the ingredients. Then, the photosensitive liquid is applied onto a substrate such as a silicon wafer, a ceramic plate, an aluminum plate, a stainless steel plate or an alloy plate to form a coating film preferably having a dry thickness of 1 to 30 µm, particularly preferably 5 to 15 µm.

The applied coating film is dried (e.g., at 80° C. for about 10 minutes) to provide a film of the negative photosensitive material, which is in turn exposed to activation radiation such as ultraviolet radiation via a photomask having a predetermined pattern. After the exposure, the negative photosensitive material film is heat-treated at a temperature not lower than 170° C., preferably 170° C. to 200° C., more preferably 180° C. to 190° C., for about 10 minutes. Thereafter, the negative photosensitive material film is developed to remove an unexposed portion thereof by a dipping method, a spray method or the like. A developing liquid to be used for the development is preferably capable of completely dissolving away the unexposed portion of the negative photosensitive material film subjected to the exposure. Examples of the developing liquid include inorganic alkaline aqueous solutions such as of sodium hydroxide and potassium hydroxide, and organic alkaline aqueous solutions such as of propylamine, butylamine, monoethanolamine, tetramethylammonium hydroxide and choline, which may be used either alone or in combination. As required, the alkaline aqueous solution may further contain an organic solvent such as an alcohol, and a surface active agent.

After the development, the resulting negative photosensitive material film is rinsed with rinse liquid, whereby a desired negative pattern image is provided.

Exemplary light sources for emitting the activation radiation for the exposure include a carbon arc lamp, a mercury vapor arc lamp, an ultra high pressure mercury lamp, a high pressure mercury lamp and a xenon lamp which are capable of effectively emitting ultraviolet radiation, and a photoflood lamp and a solar lamp which are capable of effectively emitting visible light.

The dose of the activation radiation is preferably, for example, 300 to 450 mJ/cm$^2$ (at about 300 to about 450 nm), and the cumulative dose of the activation radiation is preferably 100 to 2000 mJ/cm$^2$.

The pattern image thus formed is finally heat-treated at about 200° C. to about 400° C., whereby the polyimide precursor as a skeletal material is cyclodehydrated into a less soluble polyimide. Therefore, the negative pattern image is free from swelling with the developing liquid, and excellent in resolution.

Thereafter, the polyimide (PI) is etched so as to have a desired shape (thickness). For the PI etching, the negative pattern is dipped, for example, in a 20% ethanolamine solution of NaOH contained in a bath kept at a temperature of about 60° C. to about 90° C.

The negative pattern forming method is used, for example, for production of a circuit-containing suspension board for an HDD through gradational exposure and gradational development. In the gradational exposure process, a gradational exposure photomask is used which includes a fully light transmissive portion (exposing portion) which is fully transmissive to the activation radiation, a light blocking portion which fully blocks the activation radiation to define an unreacted portion, and a light semi-transmissive portion which does not fully block the activation radiation but transmits the activation radiation to some extent to cause a reaction to define a reacted portion. More specifically, the negative pattern forming method employing the gradational development is applicable to a wiring circuit board production method which includes the steps of forming an insulative layer on a metal base layer, forming an electrically conductive layer on the insulative layer, and forming an opening extending through the metal base layer and the insulative layer to expose a surface portion of the electrically conductive layer, which serves as a terminal formation portion to be formed with a terminal. Where the insulative layer is configured so that an opening formation portion thereof in which the opening is to be formed for exposing the electrically conductive layer has a smaller thickness than the other portion thereof, this negative pattern forming method is employed. The gradational exposure photomask has a pattern such that the light blocking portion thereof corresponds to the terminal formation portion of the electrically conductive layer, the light semi-transmissive portion thereof corresponds to the other portion of the electrically conductive layer, and the fully light transmissive portion (exposing portion) corresponds to a region in which the electrically conductive layer is not formed.

Next, an exemplary process for producing the circuit-containing suspension board will be described in detail. Prior to the detailed description of the production process, the construction of the circuit-containing suspension board will be briefly described. As shown in FIG. 1, the circuit-containing suspension board typically includes a substrate 32 having a substrate opening 43, a base layer 33 formed from the photosensitive polyamic acid composition and having a base opening 44, an electrically conductive pattern 34 formed with metal plating layers 46, and a cover layer 35 formed from the photosensitive polyamic acid composition and having a cover opening 42. A portion of the electrically conductive pattern 34 formed with an external connection terminal 38 is recessed toward the substrate 32 from the other portion of the electrically conductive pattern 34. The base opening 44 and the substrate opening 43 each have a size that is greater than the size of a portion of the electrically conductive pattern 34 formed with the metal plating layers 46.

The circuit-containing suspension board is produced, for example, in the following manner. As shown in FIG. 2A, a substrate (such as of a stainless steel or a 42-alloy) 32 is prepared, and a coating film 33a of the photosensitive polyamic acid composition is formed on the substrate 32. Then, as shown in FIG. 2B, a light semi-transmissive photomask 52 (having an average transmission factor of 1 to 99%) is placed in opposed relation to a portion (terminal formation portion) of the coating film 33a to be formed with an external connection terminal 38 separately from a fully light blocking photomask 40, and the coating film 33a is exposed to the activation radiation via the photomask 52 in a coating film exposing step. Thus, the terminal formation portion of the coating film 33a is exposed at a lower dose than the other portion of the coating film 33a. After the exposure, the resulting coating film 33a is developed as shown in FIG. 2C. Then, as shown in FIG. 2D, the photosensitive polyamic acid composition is imidized to be cured, whereby a base layer 33 is formed as having a smaller thickness portion (terminal formation portion) to be formed with the external connection terminal 38 (gradational exposure/development process).

The photomask 52 includes a light semi-transmissive portion having a light transmission factor that is reduced, for example, by: (1) finely roughening a surface of the light semi-transmissive portion thereof to promote light scattering on the surface; (2) applying a light absorbing film on the surface of the light semi-transmissive portion thereof; or (3) forming a pattern including light transmissive portions and light blocking portions in the surface of the light semi-transmissive portion thereof.

Figure 3A:
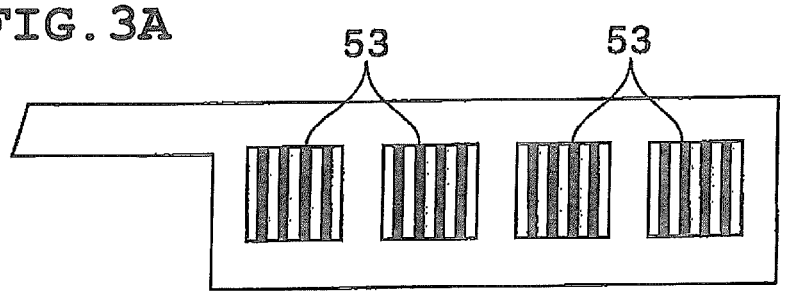
FIGS. 3A to 3D are diagrams showing exemplary photomasks to be used for the exposure of the first coating film of the photosensitive polyamic acid composition, particularly, FIG. 3A showing a photomask including semi-transmissive portions each having a stripe pattern and an average transmission factor of about 50%, FIG. 3B showing a photomask including semi-transmissive portions each having a cross grid pattern and an average transmission factor of about 25%, FIG. 3C showing a photomask including semi-transmissive portions each having a staggered round dot pattern and an average transmission factor of about 25%, and FIG. 3D showing a photomask including semi-transmissive portions each having a staggered round dot pattern and an average transmission factor of about 70%.
Figure 3B:
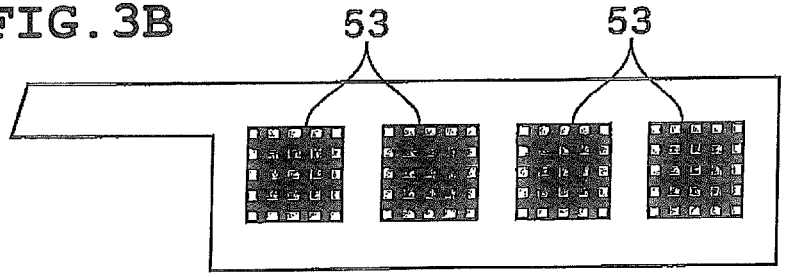
Figure 3C:
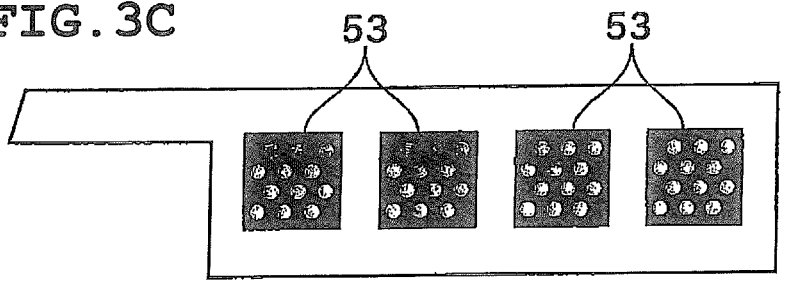
Figure 3D:
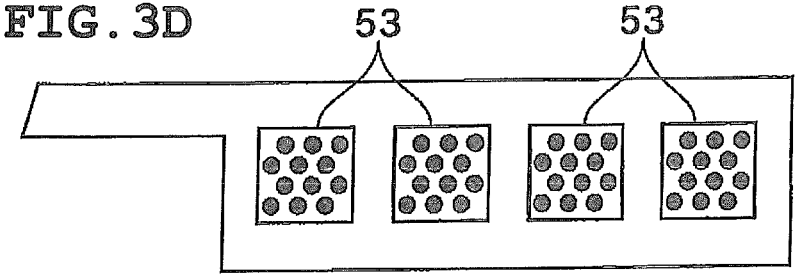

More specifically, the light semi-transmissive portion preferably has a repetitive pattern including light transmissive portions and light blocking portions arranged at a pitch of 6 µm or less (or each having a width of 6 µm or less), and preferably having an average transmission factor of 80% or lower, more preferably 50% or lower. Examples of the pattern include a stripe pattern 53 having an average transmission factor of about 50% as shown in FIG. 3A, a cross grid pattern 53 having an average transmission factor of about 25% as shown in FIG. 3B, a staggered round dot pattern 53 having an average transmission factor of about 25% as shown in FIG. 3C, and a staggered round dot pattern 53 having an average transmission factor of about 70% as shown in FIG. 3D.

The base layer 33 thus formed typically has a thickness of 2 to 30 µm. The thickness of the terminal formation portion of the base layer 33 is typically not greater than 80% of the thickness of the other portion of the base layer 33 and, for example, preferably not greater than 8 µm, further preferably not greater than 5 µm.

The lower limit of the thickness of the terminal formation portion of the base layer 33 is a minimum possible thickness that permits the base layer 33 to serve as a barrier layer for an electrically conductive pattern 34 when a hole is formed in the substrate 32. For example, the lower limit is 3 µm, preferably about 1 µm. Therefore, the thickness of the terminal formation portion of the base layer 33 is preferably, for example, 1 to 8 µm.

Subsequently, as shown in FIG. 2E, an electrically conductive pattern (such as of copper, nickel, gold, a solder or an alloy of any of these metals) 34 having a predetermined wiring circuit pattern is formed on the base layer 33. Since the terminal formation portion of the base layer 33 is thinner than the other portion of the base layer 33, a portion of the electrically conductive pattern 34 present on the terminal formation portion of the base layer 33 (i.e., a portion of the electrically conductive pattern 34 on which metal plating layers 46 are to be formed in the subsequent step) is correspondingly recessed toward the substrate 32 from the other portion of the electrically conductive pattern 34.

In turn, as shown in FIGS. 2F to 2I, the electrically conductive pattern 34 is covered with a cover layer 35 formed from the photosensitive polyamic acid composition. The formation of the cover layer 35 is achieved in the following manner. As shown in FIG. 2F, a coating film 35a of the photosensitive polyamic acid composition is first formed in the same manner as the formation of the base layer 33 by applying a solution of the photosensitive polyamic acid composition over the substrate 32 and the base layer 33 (including the electrically conductive pattern 34), and then drying the applied solution. Then, as shown in FIG. 2G, the coating film 35a is exposed to the activation radiation via a photomask 41, and then developed. Thus, the coating film 35a is patterned so as to cover the electrically conductive pattern 34 as shown in FIG. 2H. For the patterning, the photomask 41 is placed in opposed relation to a portion (terminal formation portion) of the coating film 35a to be formed with the external connection terminal 38 so that a cover opening 42 can be formed in the terminal formation portion of the coating layer 35a to partly expose a surface of the electrically conductive pattern 34. The exposure and development process for the formation of the base layer 33 and the cover opening 42 is performed under the same conditions as described above.

Subsequently, as shown in FIG. 2I, the patterned coating film 35a of the photosensitive polyamic acid composition is heated to be cured (imidized). Thus, a cover layer 35 of a polyimide is formed over the electrically conductive pattern 34. After the formation of the cover opening 42, as shown in FIG. 2J, a substrate opening 43 is formed in a portion (terminal formation portion) of the substrate 32 to be formed with the external connection terminal 38, i.e., a portion of the substrate 32 opposed to the cover opening 42 of the cover layer 35, as having a greater size than the cover opening 42 so as to partly expose the base layer 33. At the same time, as shown in FIG. 2K, a base opening 44 is formed in a portion of the base layer 33 exposed in the substrate opening 43. The formation of the substrate opening 43 and the base opening 44 is typically achieved by chemical etching. Thereafter, as shown in FIG. 1, metal plating layers 46 such as nickel plating layers or gold plating layers are formed on opposite surface portions of the electrically conductive pattern 34 exposed in the cover opening 42, the base opening 44 and the substrate opening 43, for example, by electrolytic nickel plating or electrolytic gold plating. The metal plating layer 46 thus formed in the base opening 44 and the substrate opening 43 has a periphery spaced a predetermined distance from peripheral walls of the base opening 44 and the substrate opening 43 (see FIG. 1).

Thus, the negative pattern forming method employing the gradational exposure and development process provides a flat terminal portion in a suspension board of an HDD when the external connection terminal 38 is configured as a flying lead having bare opposite surfaces.

EXAMPLES

Next, inventive examples will be described in conjunction with comparative examples. However, it should be understood that the present invention be not limited to these inventive examples.

First, polyamic acids A1 to A6 were synthesized in the following manner.

Synthesis of Polyamic Acid A1

An NMP solution of a polyamic acid having structural units represented by the formulae (1) and (2) (containing the structural unit represented by the formula (2) in a proportion of 10 mol % based on the overall amount of the polyamic acid) was prepared by putting 85.3 g (290 mmol) of 3,3',4,4'-biphenyltetracarboxylic dianhydride (BPDA), 28.22 g (261 mmol) of p-phenylenediamine (PPD), 9.29 g (29 mmol) of 2,2'-bis(trifluoromethyl)-4,4'-diaminobiphenyl (TFMB) and 792 g of N-methyl-2-pyrrolidone (NMP) in a 1000-ml four-neck flask, and stirring the resulting mixture at a room temperature (25° C.).

Synthesis of Polyamic Acids A2 to A6

NMP solutions of polyamic acids each having the structural units represented by the formulae (1) and (2) were prepared in substantially the same manner as in the synthesis of the polyamic acid A1, except that the proportions of the respective ingredients were changed as shown in Table 1. The proportions (mol %) of the structural unit represented by the formula (2) based on the overall amount of the polyamic acid are also shown in Table 1.

TABLE 1

| | BPDA | PPD | TFMB | (mmol) Proportion (mol %) of structural unit represented by formula (2) |
|---|---|---|---|---|
| Polyamic acid A1 | 290 | 261 | 29 | 10 |
| Polyamic acid A2 | 290 | 232 | 58 | 20 |
| Polyamic acid A3 | 290 | 217.5 | 72.5 | 25 |
| Polyamic acid A4 | 290 | 205.9 | 84.1 | 29 |
| Polyamic acid A5 | 290 | 174 | 116 | 40 |
| Polyamic acid A6 | 290 | 203 | 87 | 30 |

Preparation of Photosensitive Polyamic Acid Compositions I to VII

Next, solutions of photosensitive polyamic acid compositions I to VII were each prepared by blending ingredients shown in Table 2 and the corresponding NMP solution of the polyamic acid A1 to A6 thus synthesized in proportions shown in Table 2 (based on 100 g of the polyamic acid A1 to A6). A pyridine derivative B1, a pyridine derivative B2, a dissolution accelerator, Nifedipine and imidazole shown in Table 2 for use in the preparation are as follows:

Pyridine Derivative B1

A compound represented by the general formula (4) in which $R_1$, $R_2$, $R_4$ and $R_5$ are each $CH_3$ and Ar is 2-nitrophenyl group, more specifically, represented by the following structural formula (a):

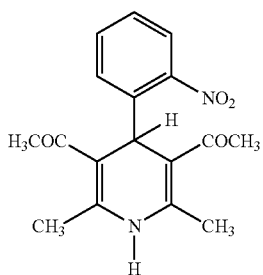

(a)

Pyridine Derivative B2

A compound represented by the general formula (3) in which $R_1$, $R_2$, $R_4$ and $R_5$ are each $CH_3$, $R_3$ is an ethyl group and Ar is 2-nitrophenyl group, more specifically, represented by the following structural formula (b):

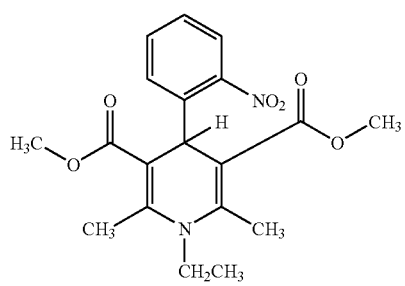

(b)

Dissolution Accelerator
ARONIX M140 available from Toagosei Co., Ltd.
Nifedipine
Available from Sanyo Chemical Laboratory Co., Ltd.
Imidazole
Available from Wako Pure Chemical Industries Ltd.

Example 1

The solution of the photosensitive polyamic acid composition I was applied onto a 19-μm thick stainless steel foil (SUS304) by a spin coater, and then heated at 100° C. for 10 minutes to be dried. Thus, a coating film of the photosensitive polyamic acid composition I (having a thickness of 10 μm) was formed (see FIG. 2A). In turn, the coating film was exposed to activation radiation (at 365 nm at 400 mJ/cm$^2$) via a photomask (see FIG. 2B), and then an exposed portion of the coating film was heated at 170° C. for 10 minutes. Thereafter, the coating film was developed with an alkaline developing liquid to be thereby patterned into a negative image (see FIG. 2C). Subsequently, the patterned coating film of the photosensitive polyamic acid composition I was heated at 400° C. at a pressure of 1.33 Pa to be cured (imidized). Thus, a base layer of a polyimide resin was formed as having a thickness of 10 μm and a predetermined pattern (see FIG. 2D).

Figure 4:
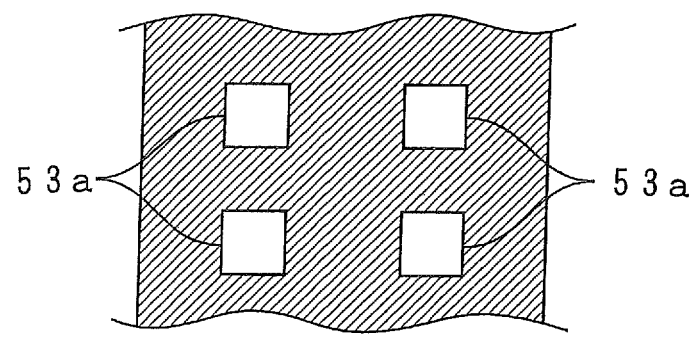
FIG. 4 is a plan view showing a photomask used for exposing a coating film of a photosensitive polyamic acid composition in Examples.

For the exposure in the formation of the base layer, a photomask having a repetitive pattern including 4-μm square light transmissive portions 53a and light blocking portions arranged at a pitch of 6 μm as shown in FIG. 4 was placed on a portion (terminal formation portion) of the coating film to be later formed with an opening for formation of each external connection terminal. With the use of this photomask, the terminal formation portion of the coating film was exposed to the activation radiation at a lower dose than the other portion of the coating film (see FIG. 2D). After the development and the curing, the terminal formation portion of the base layer had a thickness of 2 μm, while the other portion of the base layer had a thickness of 10 μm (see FIG. 2D).

After a thin chromium film having a thickness of 300 Å and a thin Cu film having a thickness of 700 Å were formed in this order as a seed layer over the stainless steel foil and the base layer by a sputtering evaporation method, a plating resist film was formed in a pattern reverse to a predetermined wiring pattern on the base layer by using a dry film resist, and then an electrically conductive pattern was formed as having the predetermined wiring pattern on a portion of the base layer not formed with the plating resist film by electrolytic copper plating through a semi-additive method (see FIG. 2E. Since the terminal formation portion of the base layer was thinner than the other portion of the base layer, a portion (terminal formation portion) of the electrically conductive pattern to be formed with the external connection terminal was recessed to a depth of about 8 μm toward the stainless steel foil from the other portion of the electrically conductive pattern. The electrically conductive pattern had a thickness of 10 μm, and

TABLE 2

| Photosensitive polyamic acid composition | Polyamic acid | Pyridine derivative B1 | Pyridine derivative B2 | Dissolution accelerator | Nifedipine | Imidazole |
|---|---|---|---|---|---|---|
| | | | | | | (g) |
| I | A1 | — | 13 | 26 | — | — |
| II | A2 | — | 13 | 26 | — | — |
| III | A3 | — | 13 | 26 | — | — |
| IV | A2 | 26 | — | — | 39 | 2.6 |
| V | A4 | — | 13 | 26 | — | — |
| VI | A5 | — | 13 | 26 | — | — |
| VII | A6 | — | 13 | 26 | — | — | included four wirings each having a width of 110 μm and arranged parallel to each other as spaced 200 μm from each other.

Thereafter, the plating resist film and then parts of the thin chromium film and the thin Cu film underlying the plating resist film were chemically etched off.

After a thin hard nickel film having a thickness of 0.1 μm was formed on a surface of the electrically conductive pattern and a surface of the stainless steel foil by electroless nickel plating method, the solution of the photosensitive polyamic acid composition I was applied over the thin nickel film and the base layer, and then heated at 100° C. Thus, a coating film of the photosensitive polyamic acid composition I was formed (see FIG. 2F). In turn, the coating film was exposed to activation radiation (at 365 nm at 400 mJ/cm$^2$) via a photomask (including 4-μm square light transmissive portions 53a arranged at a pitch of 6 μm as shown in FIG. 4) having the same configuration as described above (see FIG. 2G), and then an exposed portion of the coating film was heated at 170° C. Thereafter, the coating film was developed with an alkaline developing liquid to be thereby patterned so as to cover the electrically conductive layer (see FIG. 2H). Subsequently, the patterned coating film of the photosensitive polyamic acid composition I was heated at 400° C. to be cured (imidized). Thus, a 10-μm thick cover layer of a polyimide resin was formed over the electrically conductive layer (see FIG. 2I).

In the patterning for the formation of the cover layer, a cover opening was formed in the cover layer so as to expose a portion of the thin nickel film present on the terminal formation portion of the electrically conductive pattern.

Then, the external connection terminal was formed as having bare opposite surfaces. That is, a substrate opening having a greater size than the cover opening was first formed in a portion of the stainless steel foil opposed to the cover opening so as to expose the base layer (see FIG. 2J). The formation of the substrate opening was achieved by masking a portion of the stainless steel foil other than that to be formed with the substrate opening and then performing a polyimide (PI) etching process. In the polyimide etching process, a dipping operation was performed in a 20% ethanolamine solution of NaOH (etching development solution) contained in a bath kept at a temperature of 80° C.

Then, a portion of the thin nickel film exposed in the cover opening and a portion of the thin nickel film present on the stainless steel foil were removed.

Subsequently, a base opening was formed in a portion of the base layer exposed in the substrate opening of the stainless steel foil so as to expose the seed layer underlying the electrically conductive pattern (see FIG. 2K). The formation of the base opening was achieved by the polyimide etching process. In the polyimide etching process, a dipping operation was performed in a 20% ethanolamine solution of NaOH (etching development solution) contained in a bath kept at a temperature of 80° C.

The base opening thus formed had the same size and shape as the substrate opening, and a periphery of the seed layer exposed in the base opening was spaced about 50 μm from peripheral walls of the base opening and the substrate opening.

Thereafter, the seed layer exposed in the base opening was removed to expose a rear surface portion of the electrically conductive pattern. In turn, 2-μm thick gold plating layers were formed as the metal plating layers on the exposed opposite surface portions of the electrically conductive pattern by electrolytic gold plating. Thus, the circuit-containing suspension board formed with the external connection terminal (see FIG. 1) was produced.

The metal plating layer thus formed on the rear side had a surface located at substantially the same level as an interface between the base layer and the stainless steel foil within a deviation of ±2 μm. A periphery of the rear metal plating layer was spaced a distance of 47 μm from the peripheral walls of the base opening and the substrate opening.

The external connection terminal of the circuit-containing suspension board thus produced served as a flying lead defined by a greater width portion of each of the wirings of the electrically conductive pattern.

It is noted that a solution mixture containing a 10% aqueous solution of tetramethylammonium hydroxide (TMAH) and EKINEN (ethanol) in a weight ratio of 1:1 was used as a developing liquid for the development of the coating films of the photosensitive polyamic acid composition I.

Examples 2 to 5 and Comparative Examples 1 and 2

Circuit-containing suspension boards were produced in substantially the same manner as in Example 1, except that the photosensitive polyamic acid compositions shown in Table 3 were employed.

The circuit-containing suspension boards thus produced were each evaluated for polyimide (PI) etchability and gradational patternability in the following manner. Further, the polyimide resin films formed in the aforementioned manner were each evaluated for properties (linear expansion coefficient and hygroscopic expansion coefficient). The results are shown in Table 3.

Linear Expansion Coefficient

A test sample having a width of 5 mm and a length of 25 mm was cut out of each of the polyimide resin films. Then, the linear expansion coefficient of the test sample was measured with the use of a thermomechanical analyzer (THERMO PLUS TMA8310 available from Rigaku Corporation). More specifically, linear thermal expansion coefficients of the test sample having a measurement length of 20 mm were measured in a temperature range of 50° C. to 200° C. with a tensile load of 50 mN, while the temperature was increased at a rate of 5° C./min. Then, an average of the linear thermal expansion coefficients was determined as a linear expansion coefficient (CTE).

Hygroscopic Expansion Coefficient

A test sample having a width of 5 mm and a length of 25 mm was cut out of each of the polyimide resin films. The hygroscopic expansion coefficient of the test sample was measured with the use of a humidity-variable mechanical analyzer (Thermo Plus TMA8310+HUM1 available from Rigaku Corporation). At a constant temperature of 30° C., the test sample was stably maintained at a humidity of 3% RH for 30 minutes to 2 hours, and then the humidity of a measurement area of the test sample was changed to 20% RH and maintained for 30 minutes to 2 hours for stabilization of the test sample. Thereafter, the humidity of the measurement area was changed to 40% RH, 60% RH and 80% RH. After the test sample was stabilized at the respective humidities, the lengths of the test sample were measured with a tensile load of 50 mN, and plotted for the respective humidities. Then, the inclination of the resulting plot line was determined as the hygroscopic expansion coefficient.

PI Etching Rate

In the production of each of the circuit-containing suspension boards, a development speed (μm/min) at which the cover layer (insulative layer) of the polyimide resin film was etched off through the PI etching process was determined as the PI etching rate.

Gradational Patternability

During the gradational exposure and development process in the production of the circuit-containing suspension boards, gradation portions of the circuit-containing suspension boards were each visually evaluated. As a result, a circuit-containing suspension board having no groove between the gradation portion and the non-gradation portion was rated as acceptable (O), and a circuit-containing suspension board suffering from variation in film thickness and having a groove between the gradation portion and the non-gradation portion was rated as unacceptable (X).

It is noted that the photomask (including 4-μm square light transmissive portions 53a arranged at a pitch of 6 μm as shown in FIG. 4) was used for the exposure, and a solution mixture containing a 10% aqueous solution of tetramethylammonium hydroxide (TMAH) and EKINEN (ethanol) in a weight ratio of 1:1 was contained as the developing liquid in a bath (kept at a temperature of 45° C. to 55° C.), in which a dipping operation was performed for the development.

TABLE 3

| | Photosensitive polyamic acid composition | PI etchability (μm/min) | Gradational patternability | Linear expansion coefficient (ppm/° C.) | Hygroscopic expansion coefficient (ppm/% RH) |
|---|---|---|---|---|---|
| Example 1 | I | 2.2 | O | 14.5 | 7.7 |
| Example 2 | II | 2.1 | O | 15.5 | 7.0 |
| Example 3 | III | 1.9 | O | 15.0 | 6.5 |
| Example 4 | IV | 1.3 | O | 14.0 | 11.0 |
| Example 5 | V | 1.7 | O | 15.0 | 6.0 |
| Comparative Example 1 | VI | 1.1 | X | 15.0 | 6.0 |
| Comparative Example 2 | VII | 1.4 | O | 14.0 | 7.0 |

As apparent from the above results, Examples 1 to 5 each employing a polyamic acid containing the structural unit represented by the above general formula (2) in a proportion of less than 30 mol % based on the overall amount of the polyamic acid were excellent in PI etchability with a higher development speed and excellent in gradational patternability. Further, the polyimide resin films formed in Examples 1 to 5 each had a low linear expansion coefficient and a low hygroscopic expansion coefficient. In addition, the gold plating layer 46 of the external connection terminal 38 formed on the rear surface of the electrically conductive pattern 34 of each of the circuit-containing suspension boards of Examples 1 to 5 had a flat surface (see FIG. 1), so that the external connection terminal 38 was excellent in connection reliability.

On the other hand, Comparative Example 1 employing the polyamic acid containing the structural unit represented by the above general formula (2) in a proportion of 40 mol % based on the overall amount of the polyamic acid was poorer in gradational patternability, and poorer in PI etchability with a lower development speed. Comparative Example 2 employing the polyamic acid containing the structural unit represented by the above general formula (2) in a proportion of 30 mol % based on the overall amount of the polyamic acid was excellent in gradational patternability, but poorer in PI etchability with a lower development speed than Examples 1 to 5.

As described above, the inventive negative photosensitive material has a low linear expansion coefficient and a low hygroscopic expansion coefficient, and makes it possible to form a negative pattern image with excellent gradational patternability and excellent PI etchability. Therefore, the inventive negative photosensitive material is useful for a circuit-containing suspension board for an HDD.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. A negative photosensitive material comprising:
(A) a polyimide precursor obtained by reacting a tetracarboxylic acid component and two types of diamine components consisting of an aromatic diamine and a fluorinated and methylated benzidine, such that the fluorinated and methylated benzidine diamine component is present in a proportion of 10 to 29 mol% based on the two diamine components,
the polyimide precursor having a structural unit represented by the following general formula (1) and a structural unit represented by the following general formula (2), the structural unit represented by the general formula (2) being present in the polyimide precursor in a proportion of 10 to 29 mol% based on an overall amount of the polyimide precursor; and

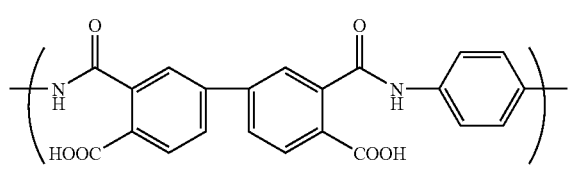

(1)

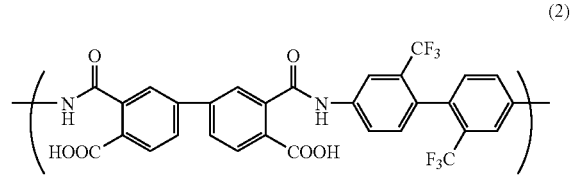

(2)

(B) at least one of a pyridine derivative represented by the following general formula (3) and a pyridine derivative represented by the following general formula (4):

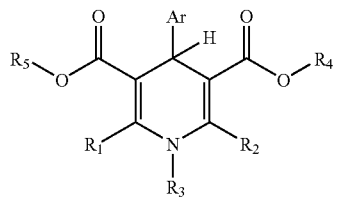

(3)

wherein $R_1$, $R_2$, $R_3$, $R_4$ and $R_5$, which may be the same or different, are each a $C_1$ to $C_4$ alkyl group, and Ar is an aryl group having a nitro group at its ortho position,

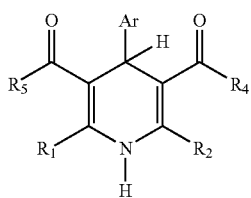

(4)

wherein $R_1$, $R_2$, $R_4$ and $R_5$, which may be the same or different, are each a $C_1$ to $C_4$ alkyl group, and Ar is an aryl group having a nitro group at its ortho position.

2. A negative photosensitive material as set forth in claim 1, which has a hygroscopic expansion coefficient of 0 to 20 ppm/%RH and a linear expansion coefficient of 0 to 20 ppm/°C.

3. A photosensitive board comprising:
a substrate; and
a coating film provided on a surface of the substrate;
the coating film being composed of a negative photosensitive material as recited in claim 1.

4. A negative pattern forming method comprising the steps:
irradiating a surface of a film with activation radiation via a photomask having a predetermined pattern, the film being a film composed of a negative photosensitive material as recited in claim 1;
heat-treating the film at a temperature not lower than 170° C.; and
removing an unexposed portion of the film by using a basic developing liquid to form a negative pattern.

5. A negative pattern forming method comprising the steps:
irradiating a surface of a film with activation radiation via a photomask having a predetermined pattern, the film being a film composed of a negative photosensitive material as recited in claim 2;
heat-treating the film at a temperature not lower than 170° C.; and
removing an unexposed portion of the film by using a basic developing liquid to form a negative pattern.

6. A negative pattern forming method comprising the steps:
irradiating a surface of a film with activation radiation via a photomask having a predetermined pattern, the film being a film composed of a coating film of a photosensitive board as recited in claim 3;
heat-treating the film at a temperature not lower than 170° C.; and
removing an unexposed portion of the film by using a basic developing liquid to form a negative pattern.

7. A negative pattern forming method comprising the steps of:
gradationally exposing a surface of a film by irradiation with activation radiation via a photomask having a predetermined pattern, the film being a film composed of a negative photosensitive material as recited in claim 1;
heat-treating the film at a temperature not lower than 170° C.; and
gradationally developing the film by using a basic developing liquid to form a negative pattern.

8. A negative pattern forming method comprising the steps of:
gradationally exposing a surface of a film by irradiation with activation radiation via a photomask having a predetermined pattern, the film being a film composed of a negative photosensitive material as recited in claim 2;
heat-treating the film at a temperature not lower than 170° C.; and
gradationally developing the film by using a basic developing liquid to form a negative pattern.

9. A negative pattern forming method comprising the steps of:
gradationally exposing a surface of a film by irradiation with activation radiation via a photomask having a predetermined pattern, the film being a film composed of a coating film of a photosensitive board as recited in claim 3;
heat-treating the film at a temperature not lower than 170° C.; and
gradationally developing the film by using a basic developing liquid to form a negative pattern.

10. A negative pattern forming method as set forth in claim 7, comprising the step of forming a flying lead configuration through the gradational exposure and the gradational development, and then forming a flat terminal configuration.

11. A negative pattern forming method as set forth in claim 9, comprising the step of forming a flying lead configuration through the gradational exposure and the gradational development, and then forming a flat terminal configuration.

12. A negative pattern forming method as set forth in claim 9, comprising the step of forming a flying lead configuration through the gradational exposure and the gradational development, and then forming a flat terminal configuration.

* * * * *

UNITED STATES PATENT AND TRADEMARK OFFICE
CERTIFICATE OF CORRECTION

PATENT NO. : 8,728,705 B2  
APPLICATION NO. : 12/788837  
DATED : May 20, 2014  
INVENTOR(S) : Katsutoshi Hirashima et al.

Page 1 of 1

It is certified that error appears in the above-identified patent and that said Letters Patent is hereby corrected as shown below:

In the Claims:

Column 19, Line 30

Change

"0to 20"

To Be

-- 0 to 20 --

Column 20, Lines 46-47

Change

"claim 9"

To Be

-- claim 8 --

Signed and Sealed this  
Twenty-third Day of September, 2014

Michelle K. Lee  
*Deputy Director of the United States Patent and Trademark Office*